(12) United States Patent
Gluschenkov et al.

(10) Patent No.: US 6,727,142 B1
(45) Date of Patent: Apr. 27, 2004

(54) ORIENTATION INDEPENDENT OXIDATION OF NITRIDED SILICON

(75) Inventors: Oleg Gluschenkov, Wappingers Falls, NY (US); Suryanarayan G. Hegde, Hollowville, NY (US); Helmut H. Tews, Munich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/284,508

(22) Filed: Oct. 29, 2002

(51) Int. Cl.[7] .......................... H01L 21/26; H01L 21/31
(52) U.S. Cl. ................... 438/246; 438/424; 438/440; 438/445; 438/770
(58) Field of Search .................. 438/259, 440, 438/444, 445, 424, 775, 513, 305, 770, 771, 772, 246, 243; 437/335; 257/315, 506

(56) References Cited

U.S. PATENT DOCUMENTS

| 5,047,359 | A | * | 9/1991 | Nagatomo .................. 438/524 |
| 5,940,718 | A | * | 8/1999 | Ibok et al. .................. 438/440 |
| 6,201,276 | B1 | * | 3/2001 | Agarwal et al. ............ 257/315 |
| 6,214,670 | B1 | * | 4/2001 | Shih et al. .................. 438/259 |
| 6,348,388 | B1 | | 2/2002 | Faltermeier et al. |
| 6,358,867 | B1 | | 3/2002 | Tews et al. |
| 6,362,040 | B1 | | 3/2002 | Tews et al. |

OTHER PUBLICATIONS

Pending application–09/874,144, filed Jun. 5 2001, group are 2812, entitled "Oxidation of silicon nitride films in semiconductor devices".

Lin et al., "Effects of post–deposition anneal on the electrical properties of Si3N4 gate dielectric", IEEE Electron Device Letters, vol. 23, No. 3, Mar. 2002, pp. 124–126.

* cited by examiner

*Primary Examiner*—Michael S. Lebentritt
(74) *Attorney, Agent, or Firm*—Todd M. C. Li

(57) ABSTRACT

Forming a vertical MOS transistor or making another three-dimensional integrated circuit structure in a silicon wafer exposes planes having at least two different crystallographic orientations. Growing oxide on different crystal planes is inherently at different growth rates because the inter-atomic spacing is different in the different planes. Heating the silicon in a nitrogen-containing ambient to form a thin layer of nitride and then growing the oxide through the thin nitrided layer reduces the difference in oxide thickness to less than 1%.

24 Claims, 6 Drawing Sheets

| WAFER ORIENTATION/PROCESS | THIN NITRIDE (NH3 BAKE TEMPERATURE) | OXIDE THICKNESS | DIT AFTER FG |
|---|---|---|---|
| <100>/ATOMIC 1050C | NO | 57.3A | 2.9 |
| <110>/ATOMIC 1050C | NO | 63.5A | 4.9 |
| <100>/ATOMIC 1050C | 650C | 51.6A | 2.7 |
| <110>/ATOMIC 1050C | 650C | 51.2A | 3.9 |
| <100>/ATOMIC 1050C | 550C | 55.8A | 2.8 |
| <110>/ATOMIC 1050C | 550C | 57.8A | 4.6 |
| <100>/ATOMIC 900C | NO | 59.1A | 3.6 |
| <110>/ATOMIC 900C | NO | 66.4A | 6.1 |
| <100>/FURNACE 800C DRY | NO | 63.1A | 3.3 |
| <110>/FURNACE 800C DRY | NO | 93.4A | 4.6 |
| <100>/FURNACE 900C DRY | NO | 64.3A | 2.2 |

FIG. 7

# ORIENTATION INDEPENDENT OXIDATION OF NITRIDED SILICON

TECHNICAL FIELD

The field of the invention is that of silicon semiconductor processing, in particular forming vertical CMOS transistors.

BACKGROUND OF THE INVENTION

In the constant drive to save space, advanced CMOS processing techniques now include CMOS transistors that are oriented vertically. When a trench is etched into a silicon substrate, a transistor formed in the trench with a vertical orientation will have its gate exposed to two different crystal orientations, and it is known in the art that oxide grows at distinctly different rates on the <100> and <110> crystal planes. The difference in growth rates on these planes typically ranges between 40% and 100%.

It has been reported in U.S. Pat. No. 6,358,867 that a growth ratio of 0.9 for the <100> and <110> planes has been achieved using a low pressure mixture of hydrogen and oxygen.

This improvement still falls short of the ideal goal of equal growth rates, which will result in still better quality transistors and other structures formed on complex multi-crystal orientation surfaces.

The art still needs an improved method of growing high-quality oxide on complex surfaces of silicon having at least two crystallographic orientations.

SUMMARY OF THE INVENTION

The invention relates to a method of growing oxide on a complex surface that achieves a ratio of growth rates of 99%.

A feature of the invention is that a small ratio of nitride thickness to final oxide thickness is preferred.

A feature of the invention is the use of a prebake step in a nitrogen-containing ambient.

Another feature of the invention is nitride deposition with the use of an ammonia ambient at an elevated temperature.

Another feature of the invention is a prebake temperature range of between 500° C. and 1100° C.

BRIEF DESCRIPTION OF THE DRAWINGS

FIG. 7 shows data from the prior art and from the invention.

DETAILED DESCRIPTION

Figure 2:
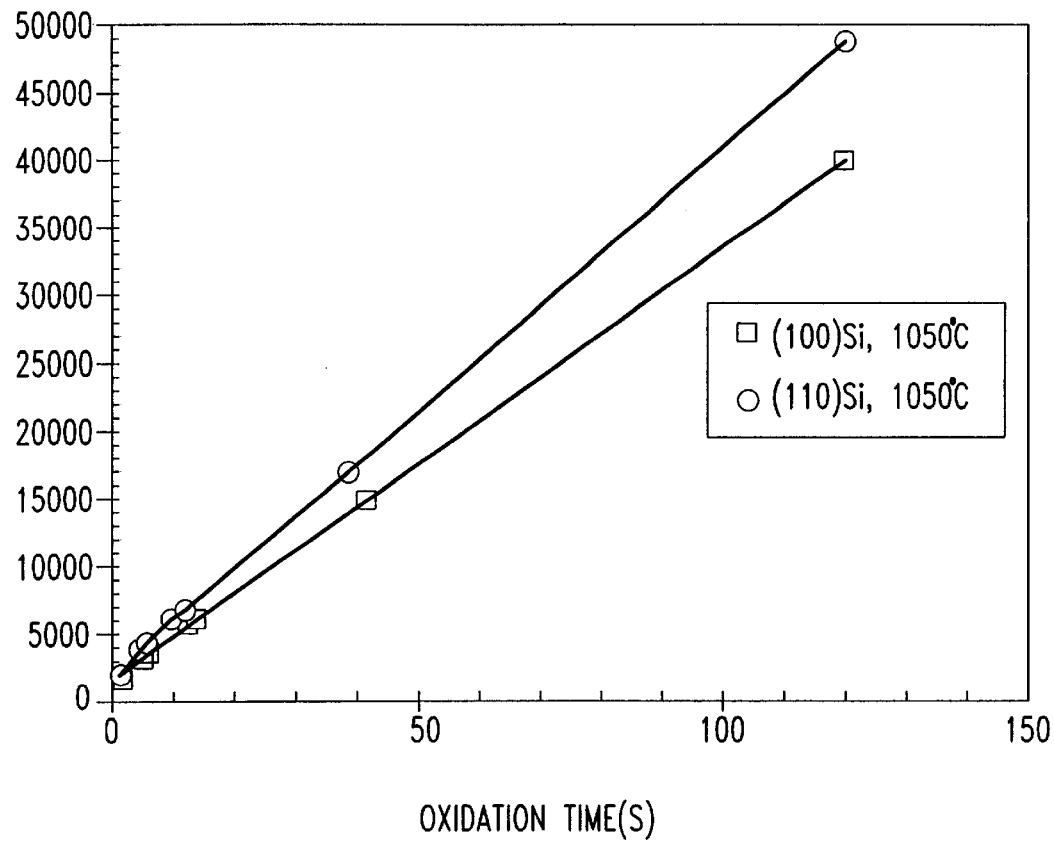
FIG. 2 (prior art) demonstrates the parabolic kinetic law for the oxidation of silicon with atomic nitrogen.
Figure 3:
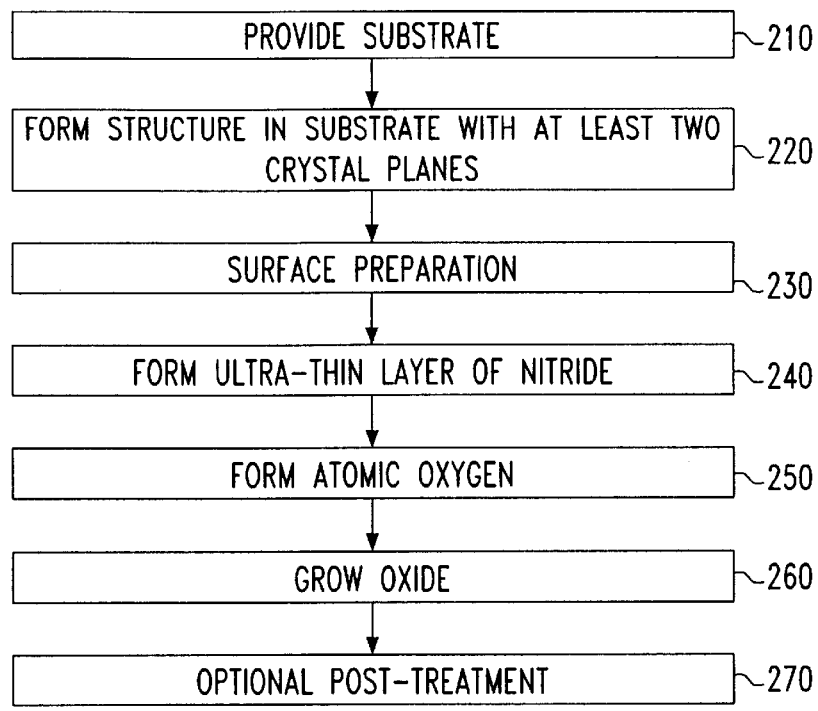
FIG. 3 shows a flow chart according to the invention.

The process according to the invention, summarized in FIG. 3, starts with a silicon wafer, whether bulk or silicon on insulator or patterned silicon on insulator (step 210 in FIG. 2). Conventional preparation steps, such as well formation, threshold implants, pad oxide ($SiO_2$) and nitride ($Si_3N_4$), etc. well known to those skilled in the art are performed.

A set of apertures in the silicon wafer are etched, e.g. shallow trenches (less than 2 micron) to isolate active areas and/or deep trenches for capacitor in DRAM cells or for other purposes (Step 220). Forming vertical transistors to save space or to increase performance in a logic circuits (i.e. non-DRAM) are also included within the scope of the invention. For instance, there is a class of high-performance 3-D logic transistor known as Fin-FETs. In a Fin-FET, the gate oxide wraps around a thin silicon pillar ("Fin") formed on top of the substrate.

The particular order in which the various features described above are formed in the substrate is not important. For instance, memory cells with vertical transistors can be formed first followed by the formation of isolation trenches, wells, high-speed logic transistors, and interconnects.

Passivation of the vertical aperture surfaces and a cleaning step, preferably with an HF-containing chemistry, are performed in Step 230. The passivation process may include a conventional (orientation-dependent) thermal oxidation of the complex silicon surface while the cleaning process may consist of a sequence of cleans designed to remove the optional passivation layer and to reduce both organic and metallic contamination of the surface. These cleaning sequences are well known in the art. Furthermore, the final amount of a chemical oxide produced by the sequence at the silicon surface can be easily controlled by selecting appropriate solution parameters during the last cleaning step. It is highly preferable for the inventive method that the amount of chemical oxide is minimized by selecting an appropriate solution at the last step.

The next step (Step 240) is to create a thin and uniform layer of silicon nitride atop of the clean multi-oriented crystal surface. The preferred way of forming such film is a thermal nitridization process. The thermal nitridization process is slow and often self-limiting, so that the resulting film thickness is insensitive to the process time and the orientation of silicon crystal, for the thermal growth of silicon nitride is diffusion limited. In general, a diffusion-limited process is sensitive to the process temperature and type of diffusing species but insensitive to the crystal orientation of underlying material. Therefore, the thickness of the thermal nitride film can be controlled by selecting process temperature and type of nitridizing species. The self-limiting nature of the process also produces greater uniformity than a conventional deposition process. Illustratively, the wafer is baked at a preferred temperature of 750° C. for 20 minutes in an ammonia ambient and produces a continuous nitride film of approximately 6–10 Å thick. Illustrative examples of other reactive nitrogen-containing gases include, but are not limited to: N2, NH3, hydrazine (N2H4), and mixtures thereof. The reactive nitrogen-containing gas can also include various nitrogen-containing radicals such as atomic nitrogen, NH2, and NH radicals. The radicals can be created with the aid of some excitation, for instance, a plasma excitation, a photo excitation, an electron-beam excitation, or intense heat. The radicals can be primarily formed either in the vicinity of the wafer or far from the processing zone. In the latter case, an efficient delivery system should be present to transfer radicals to the processing zone with minimal losses. If the nitrogen-containing gas consists of an appreciable amount of atomic nitrogen or other nitrogen-containing radicals the thermal nitride can be formed at a substantially lower temperature. The preferred temperature range in this case is from about room temperature to about 1100° C.

In some embodiments of the present invention, an in-situ cleaning procedure may be incorporated in to the Step 240 of the present invention to remove any native or chemical oxide layer that may be present on the silicon surface prior to the nitride formation. The in-situ cleaning procedure may include a thermal desorption prebake in high vacuum at a pressure of below $10^{-6}$ Torr or hydrogen (H2) ambient at a reduced pressure of below 300 Torr. Specifically, both H2 and vacuum prebaking are performed at a temperature of from about 850° C. to about 1000° C. (950° C. being preferred) and at a reduced pressure of below 300 Torr.

It is an important advantageous feature of the present invention that the nitride layer formed in Step 240 can be much thinner (preferably, at least 3 times thinner) than the target thickness of the final oxide layer. The inventive method has been proven to work even with a monolayer of silicon-nitrogen (Si—N) bonds over the silicon surface. Since the characteristic size of the Si—N bond at Si surface is about 2 Angstroms, the minimal physical thickness of the nitride film is only 2 Angstroms. Preferably, the nitride film is less than 2 nm thick.

The ability to provide a film based on such a thin layer permits greater throughput and therefore reduces cost. This feature is also counter-intuitive, since workers in the art would expect that the greatest uniformity would be provided by converting only the nitride to oxide and that reacting the different crystal structures to form oxide would result in a different oxide structure and thus a different growth rate; i.e. that a smaller ratio of nitride to oxide thickness would lead to less uniformity.

Oxidation of silicon nitride is known in the art. Some form of excitation is often required in order to convert a stable silicon nitride into silicon oxide. Highly-reactive atomic oxygen radicals can be used for this purpose. Because deposited silicon nitride is an amorphous substance, its oxidation rate does not depend on the underlying crystallographic orientation of silicon. One skilled in the art might conclude that a silicon oxide film could be produced on different orientations of silicon by first depositing a thick amorphous silicon nitride layer and then oxidizing it by known methods. The oxidation would be stopped before the underlying silicon substrate is reached, so that the different crystal orientations do not cause different growth rates. Such a method has the drawbacks that: a) the uniformity of an oxide layer grown through deposited nitride cannot be better than the uniformity of the relatively thick nitride layer; and b) the Silicon-oxide interface tends to have an excessive amount of nitrogen, which can reduce the interface mobility. The inventive method is substantially different from such an approach because it does not need a thick silicon nitride layer.

Preferably, the oxidation process employs at least some atomic oxygen, so formation of atomic oxygen is shown as Step 250. This formation process is typically combined with the heating of the wafer in an ambient (e.g. ozone) that generates free oxygen radicals. If desired, the free radicals could also be produced separately, as in an electric discharge. The atomic oxygen radicals can be also produced by reacting hydrogen and oxygen in the process chamber at a low pressure (less than 30 Torr). This chemical process is known in the art as In-situ Steam Generation (ISSG) process or as Free Radical Enhanced Rapid Thermal Oxidation (FRE RTO).

The oxide is grown thermally, illustratively at a temperature of 1050° C. by FRE RTO at 10 Torr and with 33% of hydrogen in the mixture, though the film properties are not strongly dependent on the growth temperature and hydrogen content in the mixture. Hydrogen is not required for oxidation—it is provided as a result of the choice of a particular method of forming oxygen radicals. The nitride is consumed during the oxidation process, though it provides a "memory" effect and affects the relative growth rates for the oxide on the two crystal orientations even for oxide thickness much greater than the thin nitride layer.

FIG. 2 (prior art) shows data for oxide growth at 1050° C. by FRE RTO at 10 Torr with 33% of hydrogen in the mixture for various times, on un-nitrided wafers. The square of the oxide thickness is plotted versus time, showing that the growth follows a purely parabolic kinetic law and that the oxidation process is diffusion limited. In theory, a diffusion-limited oxidation of silicon should be orientation independent because the speed of oxidation depends on the speed of diffusion of oxidizing species through the same silicon oxide. FIG. 2 demonstrates that the diffusion property of oxidizing species is different for the oxides grown on different planes. This means that these oxides have a slightly different structure.

Figure 4:
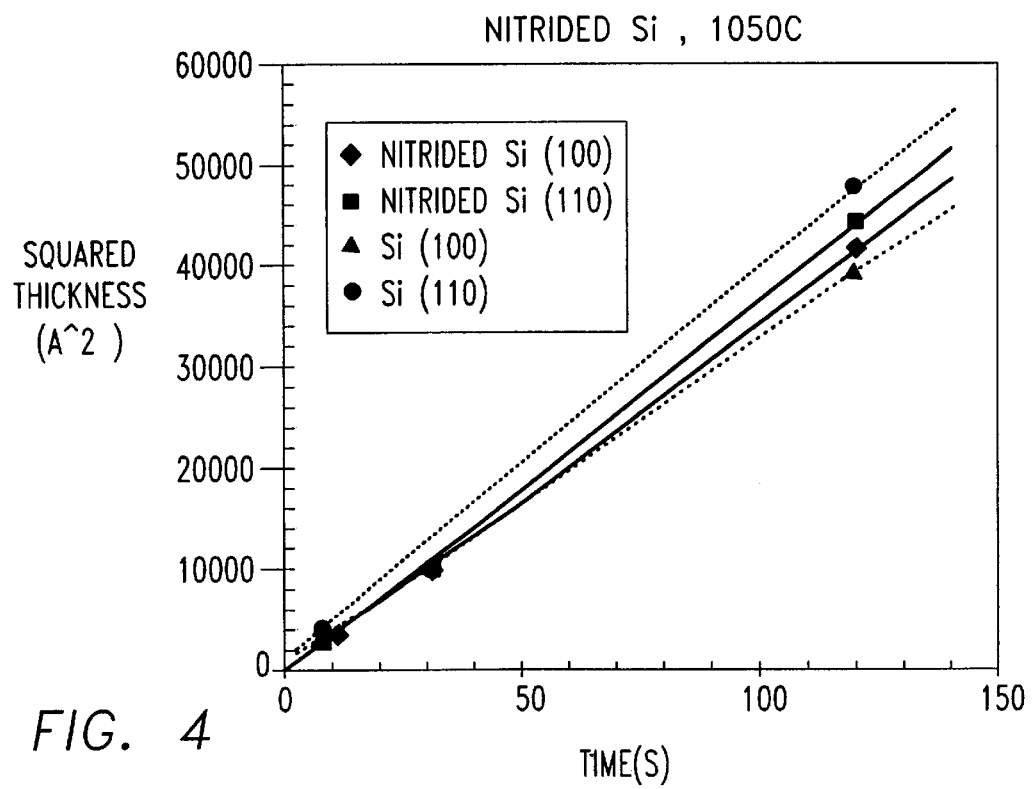
FIG. 4 shows data from the practice of the invention.

FIG. 4 shows data for oxide growth at 1050° C. by FRE RTO at 10 Torr with 33% of hydrogen in the mixture for various times, on wafers that were nitrided according to the invention and on un-nitrided wafers. The square of the oxide thickness is plotted versus time, also showing that the growth follows a purely parabolic kinetic law and that the oxidation process is diffusion limited.

This curve demonstrate clearly that the nitrided silicon wafers (solid lines) have oxide thickness on the <100> and <110> planes that are much closer than the corresponding oxide thickness for un-nitrided wafers (dotted lines). Even at the largest thickness of oxide, the difference in oxide thickness for the two crystal planes was less than 1% for the nitrided wafers (compared with 10% for the un-nitrided wafers). For oxide thickness of about 50 Å, the difference in oxide thickness for the two orientations was not detectable. This also illustrates that the presence of a thin nitride layer altered the structure of grown oxides such that the diffusion property became essentially the same.

FIG. 7 compares the quality of the oxide/silicon interface for the inventive method and standard oxidation processes. The interface quality is judged by the interface density of states at mid-gap (Dit) measured after a low temperature (400° C., 20 minutes) forming gas anneal. Lower Dit values correspond to a lower amount of charge traps at the interface and, therefore, to a better oxide. Measuring Dit values is a standard way of determining the quality of the interface. The Dit values are reported in arbitrary units for comparison only. The furnace oxides were grown in a conventional vertical oxidation furnace in dry oxygen ambient at atmospheric pressure. Clearly, the oxides formed by the inventive method have the same (or better) quality as compared to those formed by conventional methods.

Figure 5:
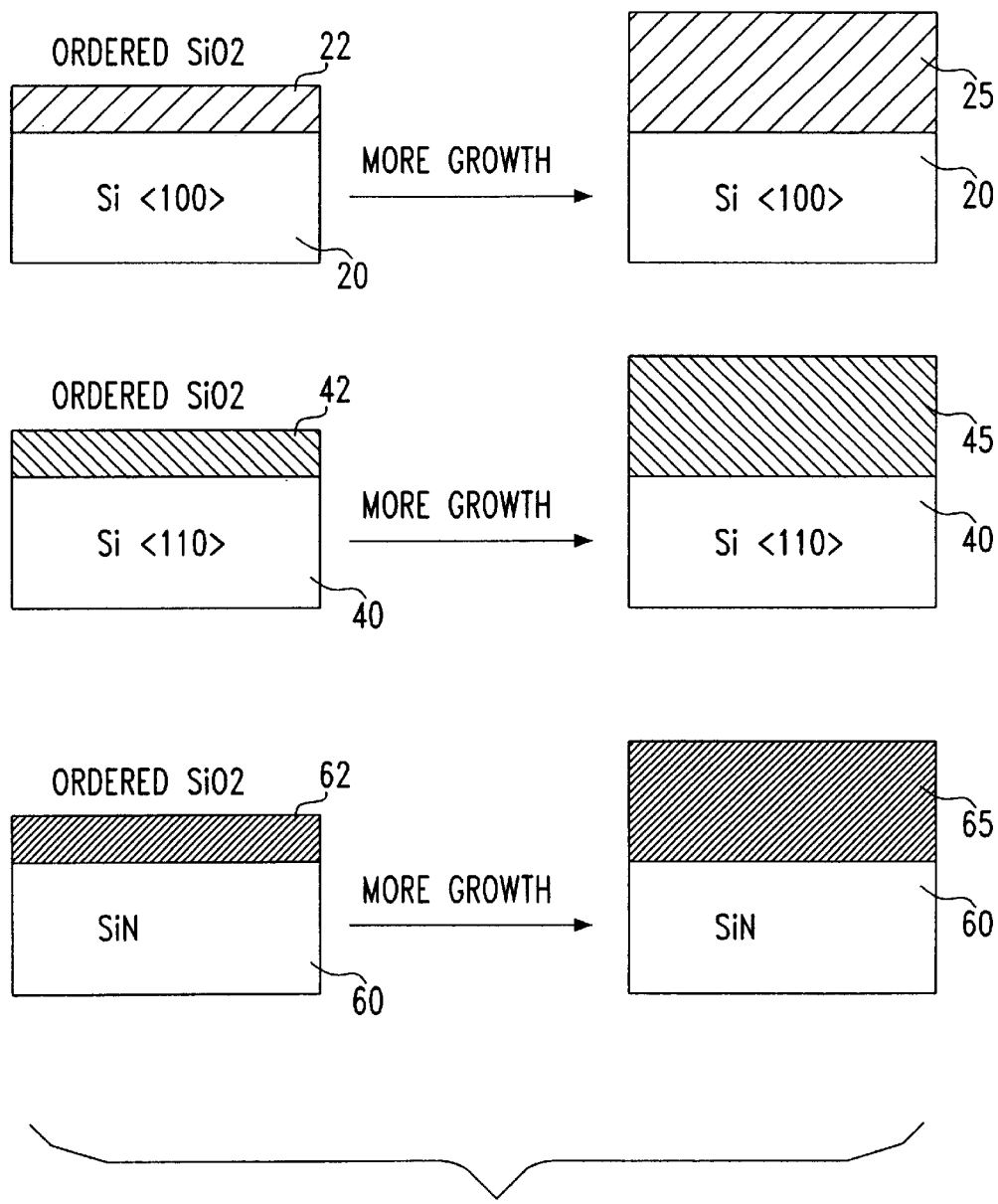
FIG. 5 illustrates the memory effect in the oxidation of silicon with atomic oxygen.
Figure 6:
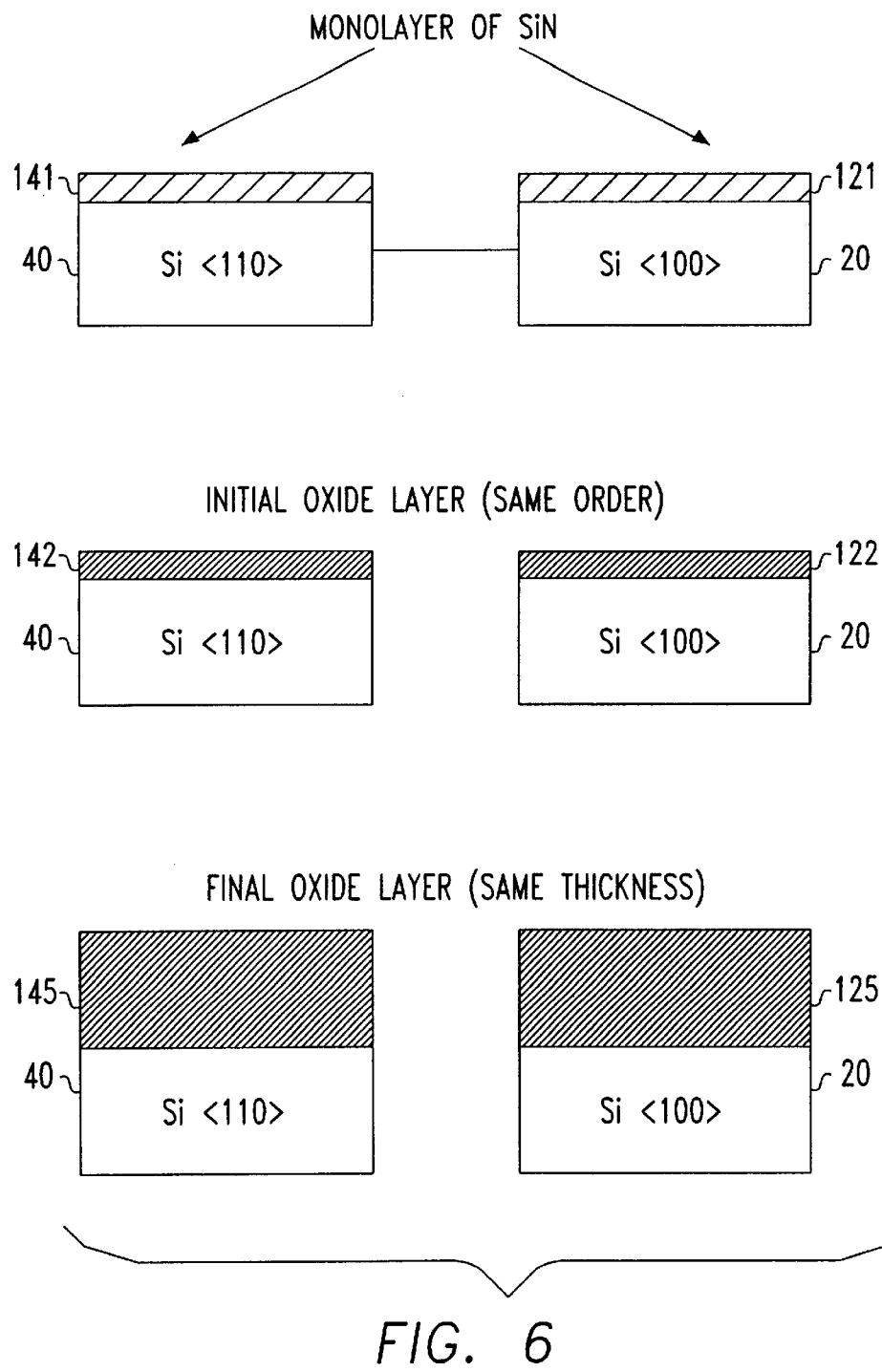
FIG. 6 illustrates the memory effect in the oxidation of nitrided silicon with atomic oxygen.

FIG. 5 and FIG. 6 illustrate the memory effect in oxidation of nitrided silicon. FIG. 5 shows, partially pictorial, partially schematic form, that the conventional oxide grown on different crystallographic orientations of silicon and on silicon nitride has a slightly different structure represented by the cross hatching, as elucidated above. We hypothesize that more oxide growth results in the repetition of the same structure. An initial thickness of oxide, 22, 42 and 62 grown on bases 20, 40 or 60 increases to a thickness 25, 45 or 65, but keeps its original structure. The thicknesses of layers 25, 45 and 65 are represented schematically by rectangles of the same height, though FIG. 2 shows that actual films will be different in thickness. FIG. 6 shows that the presence of a thin SiN layer (121, 141) on both crystallographic orientations results in substantially the same initial structure of thin silicon oxide (122, 142), shown with the same cross hatching, that grows into a final thickness 125, 145. Even though the SiN is completely converted into silicon oxide, the initial structure of the oxide repeats itself during the subsequent oxidation of the different crystal planes. It is this ability of the oxidation to remember the initial oxide structure and/or the ability to reproduce that is referred to as the "memory" effect.

Figure 1A:
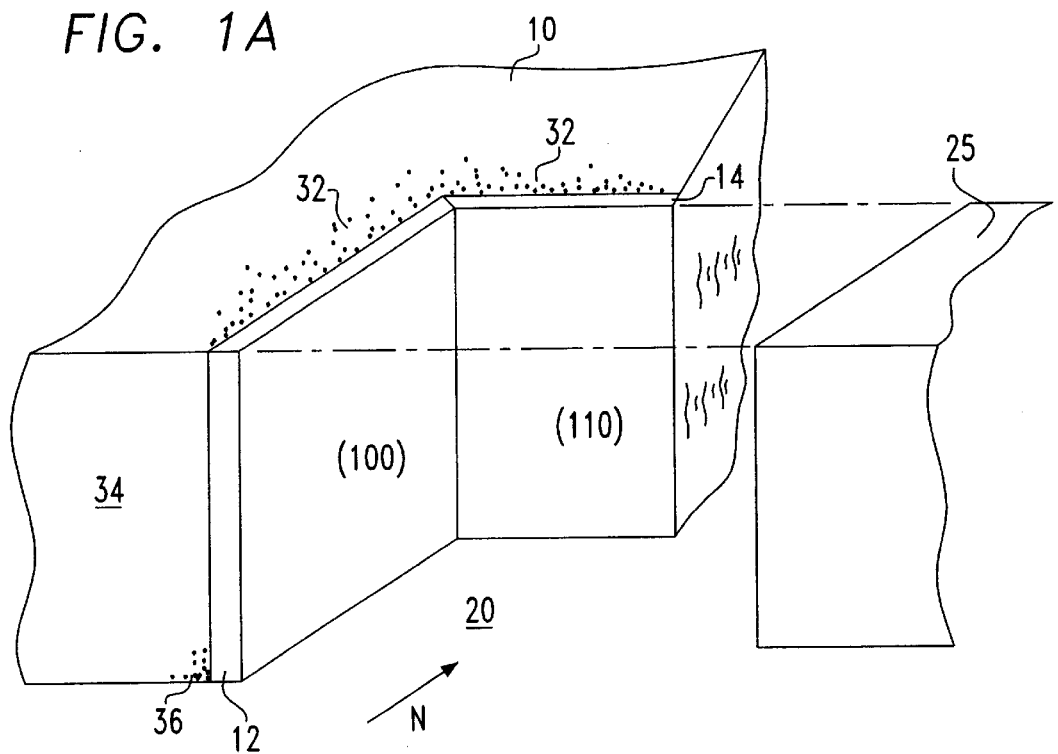
FIG. 1A shows an exploded view of a vertical transistor.
Figure 1B:
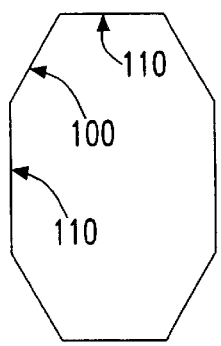
FIG. 1B shows the spatial relationship of crystal planes.

Referring now to FIG. 1A, there is illustrated an exploded view of a vertical MOS transistor according to the invention. An aperture 20 has been etched in silicon substrate 10, having sides (referred to as North and North-West) that have the <110> and <100> crystal orientation, respectively. No attempt has been made to represent the actual angle between the crystal planes (45°), which is indicated more realistically in the top view of FIG. 1B. Speckled areas 32 denote doped areas that will be the upper electrode of a transistor. Area 36 denotes the corresponding lower electrode and numeral 34 denotes the silicon area that will be the transistor body. A corresponding body area is behind the N face of aperture 20. A polysilicon plug 25 is shown as displaced from the aperture for clarity in presentation. In operation, poly 25 will fill the aperture and be the transistor gate. Gate oxide 12 and 14 complete the transistor and have been prepared according to the invention, so that the difference in thickness of the two oxide layers is about 1%.

The invention has been illustrated with reference to the <100> and <110> planes for convenience. It has been found that oxide growth on other planes, such as <111> is also the same as on the <100> and <110> planes.

Those skilled in the art will be aware that such a transistor can be used in a DRAM cell or in a logic structure employing stacked transistors.

While the invention has been described in terms of a single preferred embodiment, those skilled in the art will recognize that the invention can be practiced in various versions within the spirit and scope of the following claims.

What is claimed is:

1. A method of forming an oxide film on a complex surface of a silicon substrate comprising the steps of;
   providing a silicon substrate;
   forming a set of structures in the substrate having at least two surface planes of different crystallographic orientation in said complex surface;
   forming a layer of nitride, having a nitride thickness, on said at least two surface planes by heating the substrate in an ambient containing nitrogen such that said nitride thickness on said at least two surface planes is substantially equal; and
   growing a layer of oxide, having an oxide thickness, on said at least two planes, such that the oxide thicknesses on said at least two planes are substantially equal.

2. A method according to claim 1, in which said step of growing a layer of oxide comprises forming at least some oxygen free radicals away from said surface.

3. A method according to claim 1, in which said step of growing oxide comprises converting all of said layer of nitride to oxide and reacting at least some of the underlying silicon.

4. A method according to claim 2, in which said step of growing oxide comprises converting all of said layer of nitride to oxide and reacting at least some of the underlying silicon.

5. A method according to claim 1, in which said nitride thickness is less than one third of said oxide thickness.

6. A method according to claim 2, in which said nitride thickness is less than one third of said oxide thickness.

7. A method according to claim 3, in which said nitride thickness is less than one third of said oxide thickness.

8. A method according to claim 4, in which said nitride thickness is less than one third of said oxide thickness.

9. A method according to claim 5, in which said nitride thickness is less than 2 nm.

10. A method according to claim 6, in which said nitride thickness is less than 2 nm.

11. A method according to claim 7, in which said nitride thickness is less than 2 nm.

12. A method according to claim 8, in which said nitride thickness is less than 2 nm.

13. A method according to claim 2, in which said step of forming oxygen free radicals comprises reacting hydrogen and oxygen in the same process chamber in which the oxidation takes place at a pressure of less than about 30 Torr.

14. A method according to claim 13, in which said step of growing oxide comprises converting all of said layer of nitride to oxide and reacting at least some of the underlying silicon.

15. A method according to claim 13, in which said nitride thickness is less than one third of said oxide thickness.

16. A method according to claim 14, in which said nitride thickness is less than one third of said oxide thickness.

17. A method of forming a vertical field effect transistor in a silicon substrate comprising the steps of;
   providing a silicon substrate;
   forming a structure in the substrate having at least two vertical surface planes of different crystallographic orientation in said complex surface;
   forming a layer of nitride, having a nitride thickness, on said at least two surface planes by thermally nitriding the substrate such that said nitride thickness on said at least two surface planes is substantially equal;
   forming an upper and lower transistor electrode in proximity to a transistor body region formed in said substrate;
   growing a gate layer of oxide, having an oxide thickness, on said at least two planes, such that the oxide thicknesses on said at least two planes are substantially equal, including forming at least some oxygen free radicals that react with said layer of nitride to form oxide; and
   forming a transistor gate disposed adjacent to said gate layer.

18. A method according to claim 17, in which said step of growing oxide comprises converting all of said layer of nitride to oxide and reacting at least some of the underlying silicon.

19. A method according to claim 17, in which said nitride thickness is less than one third of said oxide thickness.

20. A method according to claim 18, in which said nitride thickness is less than one third of said oxide thickness.

21. A method according to claim 14, in which said step of forming oxygen free radicals comprises reacting hydrogen and oxygen in the process chamber at a pressure of less than about 30 Torr.

22. A method according to claim 21, in which said step of growing oxide comprises converting all of said layer of nitride to oxide and reacting at least some of the underlying silicon.

23. A method according to claim 19, in which said transistor is a Fin-FET and said at least two crystal planes are on the outer surfaces of a projecting column of said silicon substrate.

24. A method according to claim 19, in which said transistor is a vertical trench transistor and said at least two crystal planes are on the inner surfaces of an aperture formed in said silicon substrate.

* * * * *